(12) United States Patent
Kim et al.

(10) Patent No.: US 7,688,631 B2
(45) Date of Patent: Mar. 30, 2010

(54) FLASH MEMORY DEVICE FOR VARIABLY CONTROLLING PROGRAM VOLTAGE AND METHOD OF PROGRAMMING THE SAME

(75) Inventors: Moo-Sung Kim, Yongin-si (KR); Sung-Soo Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 59 days.

(21) Appl. No.: 12/171,701

(22) Filed: Jul. 11, 2008

(65) Prior Publication Data

US 2009/0207664 A1 Aug. 20, 2009

(30) Foreign Application Priority Data

Feb. 20, 2008 (KR) ...................... 10-2008-0015491

(51) Int. Cl.
*G11C 11/34* (2006.01)
*G11C 16/04* (2006.01)

(52) U.S. Cl. .............................. 365/185.18; 365/185.19

(58) Field of Classification Search ............ 365/185.18, 365/185.19, 185.2, 185.03

See application file for complete search history.

(56) References Cited

U.S. PATENT DOCUMENTS

| | | | | |
|---|---|---|---|---|
| 6,295,228 B1 * | 9/2001 | Pawletko et al. | ....... | 365/185.22 |
| 7,274,599 B2 * | 9/2007 | Lee | ................ | 365/185.22 |
| 2005/0248992 A1 * | 11/2005 | Hwang et al. | ......... | 365/185.28 |
| 2006/0092703 A1 * | 5/2006 | Chae et al. | ............. | 365/185.18 |

FOREIGN PATENT DOCUMENTS

| | | |
|---|---|---|
| KR | 1020050116283 | 12/2005 |
| KR | 1020060021097 | 3/2006 |
| KR | 1020060066958 | 6/2006 |
| KR | 1020060107689 | 10/2006 |

OTHER PUBLICATIONS

English Abstract for Publication No. 1020050116283.
English Abstract for Publication No. 1020060021097.
English Abstract for Publication No. 1020060066958.
English Abstract for Publication No. 1020060107689.

* cited by examiner

*Primary Examiner*—Anh Phung
(74) *Attorney, Agent, or Firm*—F. Chau & Associates, LLC (57) ABSTRACT

Provided is a method of programming the flash memory device including setting increments of program voltages according to data states expressed as threshold voltage distributions of multi-level memory cells. An Increment Step Pulse Programming (ISPP) clock signal corresponds to a loop clock signal and the increments of the program voltages and is generated in response to program pass/fail information. A default level enable signal is generated by performing a counting operation until reaching the increments of the program voltages, in response to the loop clock signal. An additional level enable signal is generated by performing a counting operation until reaching the increments of the program voltages, in response to the ISPP clock signal. The program voltage is increased by 1 increment, in response to the default level enable signal. The program voltage is increased by 2 increments, in response to the additional level enable signal.

20 Claims, 4 Drawing Sheets

FLASH MEMORY DEVICE FOR VARIABLY CONTROLLING PROGRAM VOLTAGE AND METHOD OF PROGRAMMING THE SAME

CROSS-REFERENCE TO RELATED APPLICATION

This application claims priority to Korean Patent Application No. 10-2008-0015491, filed Feb. 20, 2008, in the Korean Intellectual Property Office, the disclosure of which is incorporated herein in its entirety by reference.

BACKGROUND OF THE INVENTION

1. Technical Field

The present invention relates to a flash memory device, and more particularly, to a flash memory device capable of variably controlling a program voltage and a method of programming the flash memory device.

2. Discussion of the Related Art

One of the main issues in developing semiconductor memory devices is to maximize data storage capacity. Data storage capacity can be increased by increasing the number of bits of data that can be stored per unit area, and accordingly, memory chips have been developed that can store large amounts of data in a minimum area. One technique for increasing the data storage capacity of a memory chip involves storing multiple levels of charge in each memory cell. Memory chips that employ this technique are known as "multi-level" memory chips.

One type of semiconductor memory device is a flash memory device. Flash memory devices are capable of retaining data even in the absence of power. In flash memory devices, data programming and erasing may be achieved using a tunneling phenomenon. Flash memory devices are suitable for use as auxiliary storage devices due to their excellent data storage capability, low power consumption, and high durability to external shocks. There are two types of flash memory devices, NAND flash memory and NOR flash memory. The size of a memory cell in a NAND flash memory device in which a fixed number of memory cells are connected in series is smaller than the size of a memory cell in a NOR flash memory device in which memory cells are connected in parallel. Accordingly, the NAND flash memory device has excellent integration and thus is more suitable for use as a high-capacity auxiliary storage device.

Figure 1:
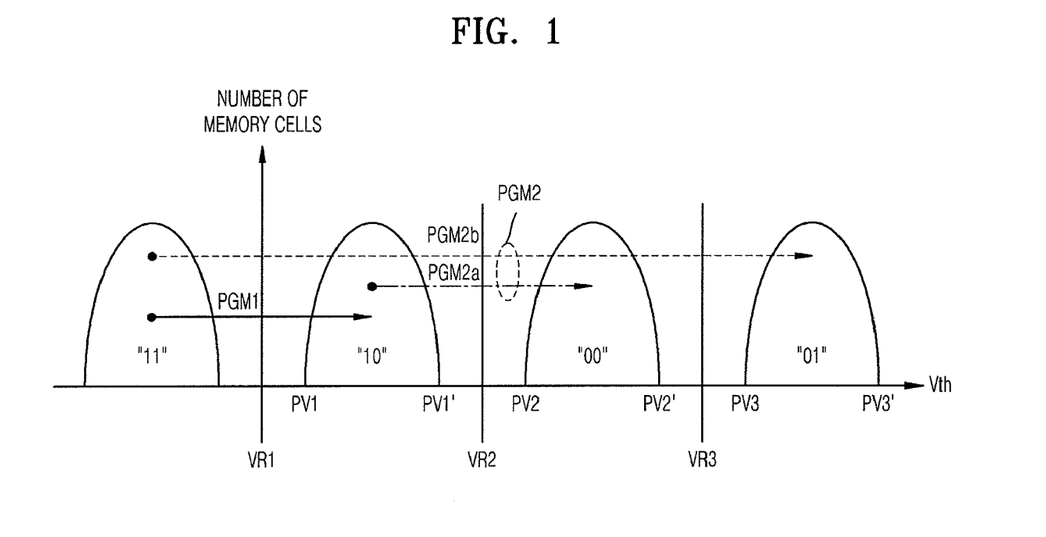
FIG. 1 illustrates threshold voltage distributions in each state of multi-level memory cells of a flash memory device.

Unlike the NAND flash memory device having single level cells, the NAND flash memory device having multi-level cells stores 2 bits of data in one cell and is characterized by four states, as illustrated in FIG. 1. FIG. 1 shows a threshold voltage distribution of the four states. An unprogrammed state is characterized by a distribution below a first read voltage VR1. A first programmed state is characterized by a distribution between PV1 and PV1'. A second programmed state is characterized by a distribution between PV2 and PV2'. A third programmed state is characterized by a distribution between PV3 and PV3'. However, when the distribution between PV1 and PV1', the distribution between PV2 and PV2', and the distribution between PV3 and PV3' are widened, an interval between PV1' and PV2 and an interval between PV2' and PV3 are narrowed. The narrowed intervals between the programmed states make it more likely that a programmed memory cell is incorrectly read and accordingly, memory cell reliability is reduced. Thus, an increase of the threshold voltage distribution of programmed cells is used for multi-level cells.

The threshold voltage distribution of the NAND flash memory device may be accurately controlled by using an Increment Step Pulse Programming (hereinafter, referred to as "ISPP") method. In the ISPP method, the program voltage is increased in stages by a determined increment by a repetition of program loops of a program cycle. As a programming operation progresses, the threshold voltages of the programmed cells are increased by an increment determined in each program loop. Accordingly, the increment of the program voltage is small to allow for the threshold distributions of programmed cells to be narrow in width. However, when the increment of the program voltage decreases, the number of program loops increases. Thus, programming characteristics worsen.

SUMMARY OF THE INVENTION

Exemplary embodiments of the present invention provide a method of programming a flash memory device, wherein an increment of a program voltage varies. Accordingly, the number of program loops may be reduced and an optimum threshold voltage distribution is obtained.

Exemplary embodiments of the present invention also provide a flash memory device which executes the programming method described above.

According to an aspect of the present invention, there is provided a method of programming a flash memory device, the method includes setting increments of program voltages according to each data state from threshold voltage distributions of multi-level memory cells in each data state obtained as a result of testing the flash memory device having the multi-level memory cells. An Increment Step Pulse Programming (ISPP) clock signal is generated. The ISPP clock signal corresponds to a loop clock signal and the increments of the program voltages. The ISPP is applied in response to program pass/fail information. A default level enable signal is generated by performing a counting operation until reaching the increments of the program voltages, in response to the loop clock signal. An additional level enable signal is generated by performing a counting operation until reaching the increments of the program voltages, in response to the ISPP clock signal. The program voltage is increased by 1 increment, in response to the default level enable signal. The program voltage is increased by 2 increments that are each less than the 1 increment, in response to the additional level enable signal.

The method may further include distributing the program voltage. The distributed program voltage is compared with a reference voltage and a pumping clock signal is generated according to the result of the comparison. The program voltage is generated in response to the pumping clock signal.

According to an aspect of the present invention, there is provided a flash memory device including a program control logic unit which generates a loop clock signal and an Increment Step Pulse Programming (ISPP) information signal, in response to program pass/fail information. An ISPP control logic unit generates a default level enable signal and an additional level enable signal, in response to the loop clock signal and the ISPP information signal. A program voltage regulator variably increases the program voltage, distributes the program voltage to compare it with a reference voltage, and generates a pumping clock signal according to the result of the comparison, in response to the default level enable signal and the additional level enable signal. A charge pump unit generates the program voltage, in response to the pumping clock signal.

The ISPP information signal may include information pertaining to the increments of the program voltages in each data state determined from threshold voltage distributions of the multi-level memory cells obtained as a result of testing the flash memory device.

The ISPP control logic unit may include a clock generator which receives the loop clock signal and ISPP information signal and generates an ISPP clock signal. A first counter performs a counting operation and generates the corresponding default level enable signal when output values of the first counter reach target increments of the program voltages, in response to the loop clock signal. A second counter performs a counting operation and generates the corresponding additional level enable signal when output values of the second counter reach target increments of the program voltages, in response to the ISPP clock signal.

The program voltage regulator may include a plurality of first and second resistors connected between the program voltage and the distributed program voltage in series. A first level control unit selectively short-circuits the first resistors, in response to the default level enable signal. A second level control unit selectively short-circuits the second resistors, in response to the additional level enable signal. A level detection and a pumping clock control unit receives an oscillation signal, compares the distributed program voltage and the reference voltage, and generates the oscillation signal as the pumping clock signal according to the result of the comparison.

The first level control unit may include a plurality of switches transmitting a high voltage in response to the default level enable signal. A plurality of high voltage NMOS transistors selectively short-circuit the first resistors, in response to outputs of the switches.

The second level control unit may include a plurality of switches transmitting a high voltage in response to the additional level enable signal. A plurality of high voltage NMOS transistors selectively short-circuit the second resistors, in response to outputs of the switches.

The level detection and pumping clock control unit may include a comparator which compares the distributed program voltage with the reference voltage, a NAND gate which receives an output of the comparator and the oscillation signal, and an inverter which receives an output of the NAND gate to output as the pumping clock signal.

According to an aspect of the present invention, there is provided a flash memory device including a program control logic unit which generates a loop clock signal, an Increment Step Pulse Programming (ISPP) information signal, a discharge enable signal, and a regulator enable signal, in response to program pass/fail information. An ISPP control logic unit generates a default level enable signal and an additional level enable signal, in response to the loop clock signal and the ISPP information signal. A program voltage regulator variably increases the program voltage, distributes the program voltage to generate a first voltage, compares the first voltage with a reference voltage, and generates a pumping clock signal, in response to the discharge enable signal, the default level enable signal, the additional level enable signal, and the regulator enable signal. A charge pump unit generates the program voltage, in response to the pumping clock signal.

The program voltage regulator may include a discharge circuit unit which discharges the program voltage to a power voltage, in response to the discharge enable signal. A first level control unit includes a plurality of first resistors connected between the program voltage and second voltage in series and selectively short-circuits the first resistors, in response to the default level enable signal. A second level control unit includes a plurality of second resistors connected between the second voltage and the first voltage in series and selectively short-circuits the first resistors, in response to the additional level enable signal. A level detection and pumping clock control unit receives an oscillation signal, compares the first voltage with the reference voltage, and generates the oscillation signal as a pumping clock signal according to the result of the comparison.

The discharge circuit unit may include a PMOS transistor connected in series between the power voltage and the program voltage and a NMOS transistor of a high voltage depletion type. The gate of the PMOS transistor is connected to the discharge enable signal and the gate of the high voltage depletion type NMOS transistor is connected to the power voltage.

The regulator enable circuit unit may include a resistor and a NMOS transistor connected in series between the first voltage and ground voltage, wherein the gate of the NMOS transistor is connected to the regulator enable signal.

BRIEF DESCRIPTION OF THE DRAWINGS

The above and other features and aspects of exemplary embodiments of the present invention will become more apparent by the detailed description provided below presented with reference to the attached drawings in which.

DETAILED DESCRIPTION OF THE EXEMPLARY EMBODIMENT

Hereinafter, exemplary embodiments of the present invention will be described more fully with reference to the accompanying drawings. In the drawings, like reference numerals may denote like elements.

With regard to the method of programming multi-level cells illustrated in FIG. 1, when the memory cells are programmed, LSB data is programmed first and then MSB data is programmed. Here, when programming data forming MSB data or LSB data is "1," the threshold voltages of the memory cells are not changed by a programming operation and data in the memory cells is not changed. Accordingly, programming of data is not accomplished. When programming data forming MSB data or LSB data is "0," the threshold voltages of the memory cells are changed and accordingly, data in the memory cells is changed. Accordingly, programming of data is accomplished.

Data in the memory cells in an elimination state has the value "11." LSB data is programmed in the memory cells in a first programming stage PGM1 and has the value "10." The state of the memory cells is read to determine whether the data in the memory cells has the value "11" or "10" and then MSB data is programmed in a second programming stage PGM2.

Figure 2:
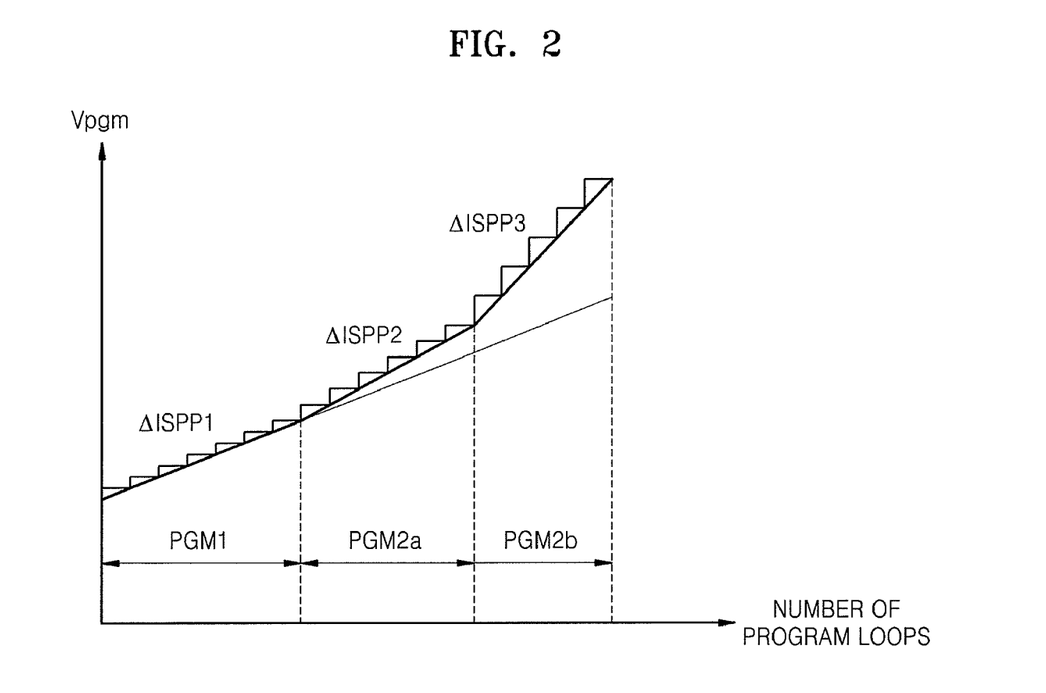
FIG. 2 is a conceptual diagram illustrating an Increment Step Pulse Programming (ISPP) variably controlling method, according to an exemplary embodiment of the present invention, when the threshold voltage distributions of multi-level memory cells of FIG. 1 are obtained.

FIG. 2 is a conceptual diagram illustrating an Increment Step Pulse Programming (ISPP) variably controlling method, according to an exemplary embodiment of the present invention. According to this approach, the threshold voltage distributions of the multi-level memory cells of FIG. 1 are obtained. Referring to FIG. 2, the increment of the program voltage Vpgm is set to ΔISPP1 in the first programming stage PGM1 in which the state of data is changed from "11 " to "10," the increment of the program voltage Vpgm is set to ΔISPP2 in the programming stage PGM2a in which the state of data is changed from "10" to "00," and the increment of the program voltage Vpgm is set to ΔISPP3 in the programming stage PGM2b in which the state of data is changed from "11" to "01." For example, ΔISPP1, ΔISPP2, and ΔISPP3 are respectively set to 0.3V, 0.4V, and 0.5V.

In terms of the programming time, the programming time for MSB data is longer that that for LSB data. The programming time for the multi-level cells is determined by the programming time for MSB data. When the increment of the program voltage Vpgm increases, the number of program loops may be reduced. For example, the number of program loops in the programming stage PGM2a in which ΔISPP2 is 0.4V is less than the number of program loops in the programming stage PGM1 where ΔISPP1 is 0.3V. Also, the number of program loops in the programming stage PGM2b where ΔISPP3 is 0.5V is less than the number of program loops in the programming stage PGM2a in which ΔISPP2 is 0.4V. ΔISPP1, ΔISPP2, and ΔISPP3 are respectively set to 0.3V, 0.4V, and 0.5V for the purpose of increasing to maximum a programming property so as to narrow the threshold voltage distributions of finally programmed cells from the threshold voltage distributions of the multi-level memory cells in each state obtained by testing the flash memory device. Accordingly, the intervals between PV1' and PV2 and the intervals between PV2' and PV3 are widened and thus the reliability of a cell operation is increased.

Figure 3:
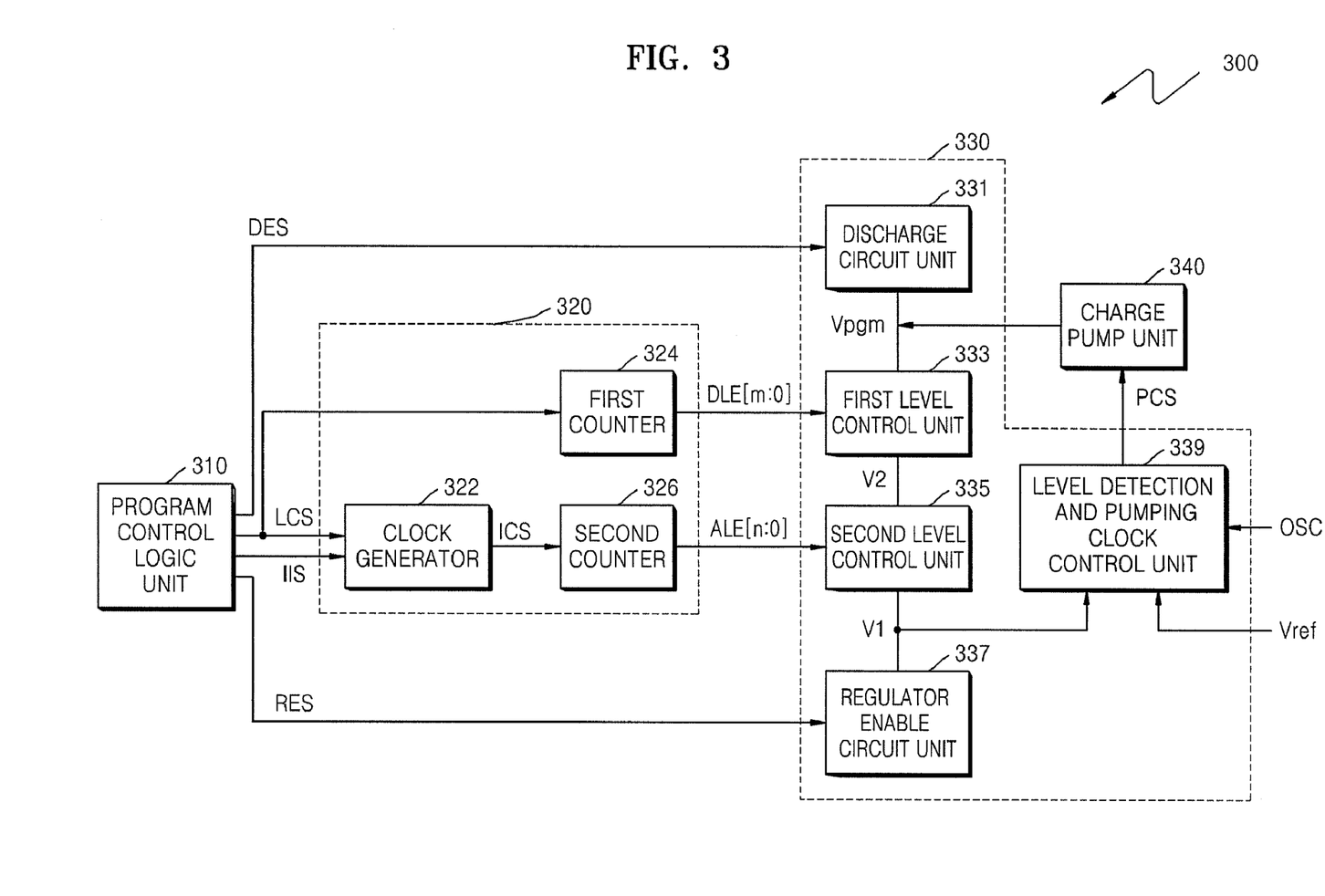
FIG. 3 is a block diagram of a flash memory device performing the ISPP variably controlling method of FIG. 2, according to an exemplary embodiment of the present invention.

FIG. 3 is a block diagram of a flash memory device performing the ISPP variably controlling method of FIG. 2, according to an exemplary embodiment of the present invention. Referring to FIG. 3, the flash memory device 300 includes a program control logic unit 310, an ISPP control logic unit 320, a program voltage regulator 330, and a charge pump unit 340.

In response to pass/fail information, the program control logic unit 310 generates a loop clock signal LCS, an ISPP information signal ISPP, a discharge enable signal DES, and a regulator enable signal RES. The pass/fail information is provided as a result of a determination as to whether data values output from a detection amplifier and latch circuit (not shown) in the flash memory device during a verifying operation for programming/elimination are equal to one another (for example, pass data values). When it is determined that the current program loop has failed, the program control logic unit 310 activates the loop clock signal LCS to a pulse signal. The ISPP information signal ISPP indicates information on the increments ΔISPP1, ΔISPP2, and ΔISPP3 of the program voltages determined from the threshold voltage distributions of the multi-level memory cells in each state obtained by testing the flash memory device. The discharge enable signal DES discharges the high program voltage Vpgm to power voltage VDD, and the regulator enable signal RES enables an operation of the program voltage regulator 330.

In response to the loop clock signal LCS and the ISPP information signal ISS, the ISPP control logic unit 320 generates a default level enable signal DLE[m:0] and an additional level enable signal ALE[n:0]. The ISPP control logic unit 320 includes a clock generator 322 and first and second counters 324 and 326. The clock generator 322 receives the loop clock signal LCS and the ISPP information signal IIS and generates an ISPP clock signal ICS.

In response to the loop clock signal LCS, the first counter 324 performs a counting operation and generates the corresponding default level enable signal DLE[m:0] when output values of the first counter 324 reach target values corresponding to the increments ΔISPP1, ΔISPP2, and ΔISPP3 of the program voltages. The initial value of the first counter 324 is obtained as a result of testing the flash memory device and is determined by a program circuit (not shown). The program circuit (not shown) may be realized using a fuse circuit or a register programmed to store the initial value of the first counter 324.

In response to the ISS clock signal ICS, the second counter 326 performs a counting operation and generates the corresponding additional level enable signal ALE[n:0] when output values of the second counter 326 reach target values corresponding to the increments ΔISPP1, ΔISPP2, and ΔISPP3 of the program voltages. The initial value of the second counter 326 is also determined by the program circuit (not shown).

In response to the discharge enable signal DES, default level enable signal DLE[m:0], additional level enable signal ALE[n:0], and regulator enable signal RES, the program voltage regulator 330 generates the program voltage Vpgm. The program voltage regulator 330 includes a discharge circuit unit 331, a first level control unit 333, a second level control unit 335, a regulator enable circuit unit 337, and a level detection and pumping clock control unit 339. The program voltage regulator 330 is described with reference to FIG. 4.

Figure 4:
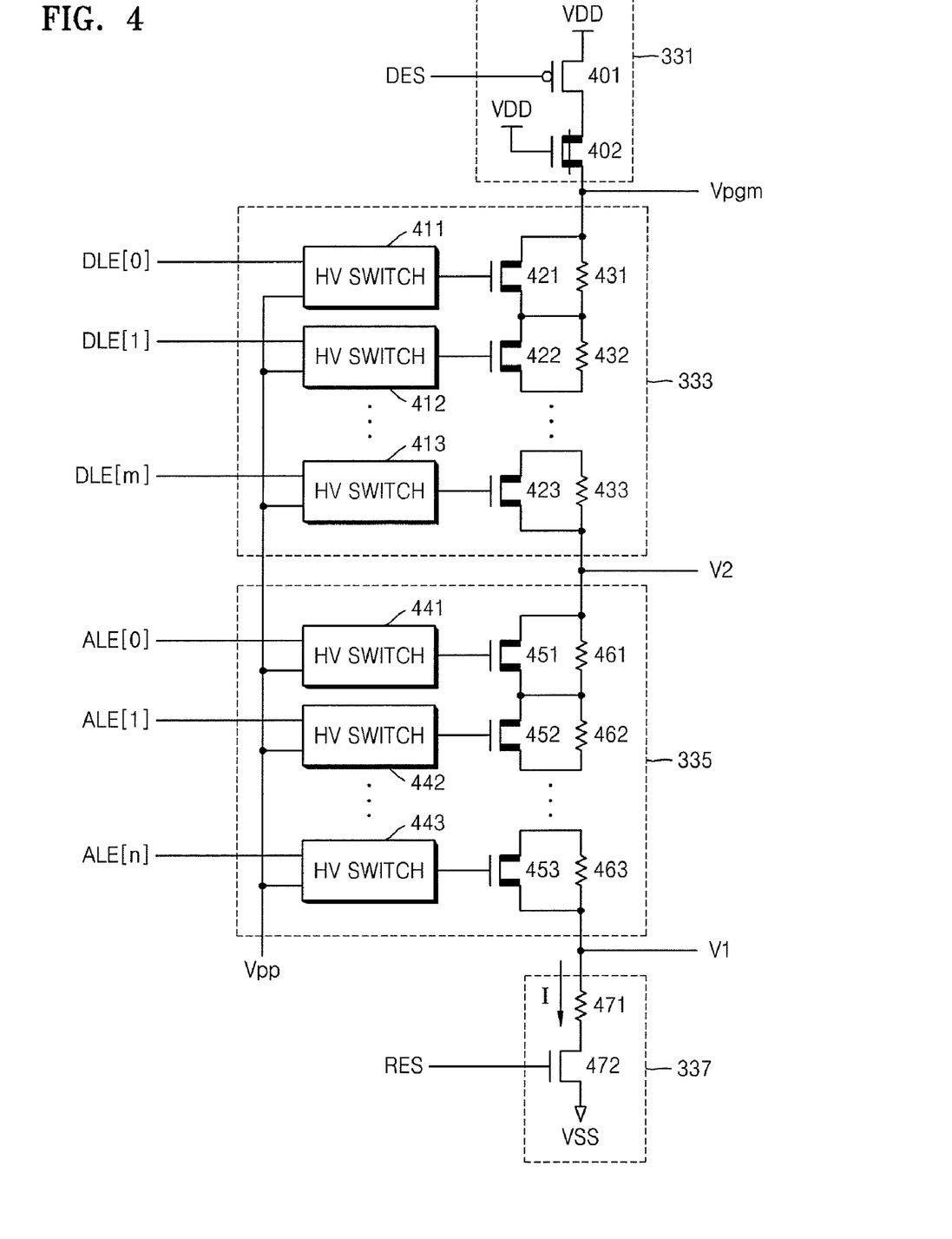
FIG. 4 is a diagram for explaining a program voltage regulator of FIG. 3, according to an exemplary embodiment of the present invention.

Referring to FIG. 4, the discharge circuit unit 331 includes a PMOS transistor 401 and a NMOS transistor 402, the PMOS transistor 401 connecting between the power voltage VDD and the program voltage Vpgm in series and the NMOS transistor 402 being a high voltage depletion type. The discharge enable signal DES is connected to a gate of the PMOS transistor 401 and the power voltage VDD is connected to a gate of the high voltage depletion type NMOS transistor 402. In response to the discharge enable signal DES at a logic low level, the discharge circuit unit 331 discharges the program voltage Vpgm to the power voltage VDD.

The first level control unit 333 includes a plurality of high voltage switches 411-413 transmitting high voltage VPP in response to the default level enable signal DLE[m:0]. A plurality of resistors 431-433 connect the program voltage Vpgm and second voltage V2 in series. A plurality of high voltage NMOS transistors 421-423 selectively short-circuit the resistors 431-433 in response to outputs of the high voltage switches 411-413.

The second level control unit 335 includes a plurality of high voltage switches 441-443 transmitting high voltage VPP in response to the additional level enable signal ALE[n:0]. A plurality of resistors 461-463 connect the second voltage V2 and first voltage V1 in series. A plurality of high voltage NMOS transistors 451-453 selectively short-circuit the resistors 461-463 in response to outputs of the high voltage switches 441-443.

The program voltage Vpgm is determined by resistance values, the resistance values being determined by the resistors 431-433 selectively short-circuited in the first level control unit 333 and the resistors 461-463 selectively short-circuited in the second level control unit 335. For example, the resistance values of the resistors 431-433 selectively short-circuited are increased as a coding value of the default level enable signal DLE[m:0] increases by +1 and the program voltage Vpgm is increased by 0.3V as a default value according to the increased resistance values. Also, the resistance values of the resistors 461-463 selectively short-circuited are increased as a coding value of the additional level enable signal ALE[n:0] increases by +1 and the program voltage Vpgm is increased by 50 mV according to the increased resistance values. If the coding value of the additional level enable signal ALE[n:0] increases by +2, the program voltage Vpgm is increased by 0.1 V. When the increment of the program voltage Vpgm is set to 0.4V according to the ISPP information signal ISS, the coding value of the default level enable signal DLE[m:0] increases by +1 and the coding value of the additional level enable signal ALE[n:0] increases by +2, thereby increasing the program voltage Vpgm by 0.4 V.

The regulator enable circuit unit 337 includes a resistor 471 connected between the first voltage V1 and ground voltage VSS in series and a NMOS transistor 472. The gate of the NMOS transistor 472 is connected to the regulator enable signal RES. In response to the regulator enable signal RES at a logic high level, a predetermined current I flows through the regulator enable circuit unit 337.

The relationship between the first voltage V1 and the program voltage Vpgm is described below.

When the resistance value of the resistor 471 of the regulator enable circuit unit 337 is R1 and the resistance value obtained by adding the resistance value of the level control unit 333 to the resistance value of the second level control unit 335 is R2, the first voltage V1 is represented by Equation 1.

$$V1 = Vpgm\left(\frac{R1}{R1+R2}\right) \quad \text{[Equation 1]}$$

Referring back to FIG. 3, the level detection and pumping clock control unit 339 compares the first voltage V1 with a reference voltage Vref and outputs an oscillation signal OSC from an oscillator (not shown) as a pumping clock signal PCS according to the result of the comparison.

Figure 5:
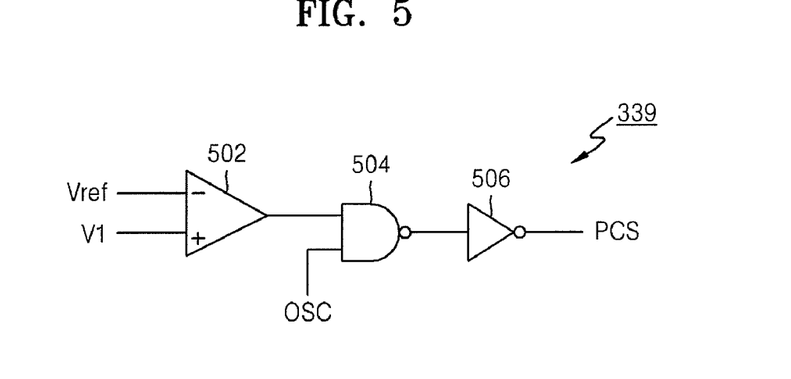
FIG. 5 is a diagram for explaining a level detection and pumping clock control unit of FIG. 3, according to an exemplary embodiment of the present invention.

FIG. 5 is a diagram for explaining the level detection and pumping clock control unit 339 of FIG. 3.

Referring to FIG. 5, the level detection and pumping clock control unit 339 includes a comparator 502, a NAND gate 504, and an inverter 506. The comparator 502 compares the first voltage V1 with the reference voltage Vref, the NAND gate 504 receives an output of the comparator 502 and the oscillation signal OSC, and the inverter 506 receives an output of the NAND gate 504 and outputs the pumping clock signal PCS.

In the comparator 502, when the first voltage V1 is less than the reference voltage Vref, the output signal is at a logic high level and when the first voltage V1 is greater than the reference voltage Vref, the output signal is at a logic low level. When the output of the comparator 502 is at a logic high level, the oscillation signal OSC is output as the pumping clock signal PCS. When the output of the comparator 502 is at a logic low level, the pumping clock signal PCS is not generated.

In response to the pumping clock signal PCS, the charge pump unit 340 generates the program voltage Vpgm as shown in FIG. 3.

The program voltage Vpgm is obtained from the relationship between the first voltage V1 and the reference voltage Vref determined by Equation 1 and is represented as in Equation 2.

$$Vpgm = Vref\left(1 + \frac{R2}{R1}\right) \quad \text{[Equation 2]}$$

As shown in Equation 2, since the resistance value R1 is a fixed value, the increment of the program voltage Vpgm is in proportion to the change rate of the resistance value R2. For example, as the resistance value R2 increases, the increment of the program voltage Vpgm increases. As the coding value of the default level enable signal DLE[m:0] according to the loop clock signal LCS and the coding value of the additional level enable signal ALE[n:0] according to the ISPP clock signal ICS increase, the resistance value R2 increases. This indicates that the program voltage Vpgm is incrementally increased in stages.

Figure 6A:
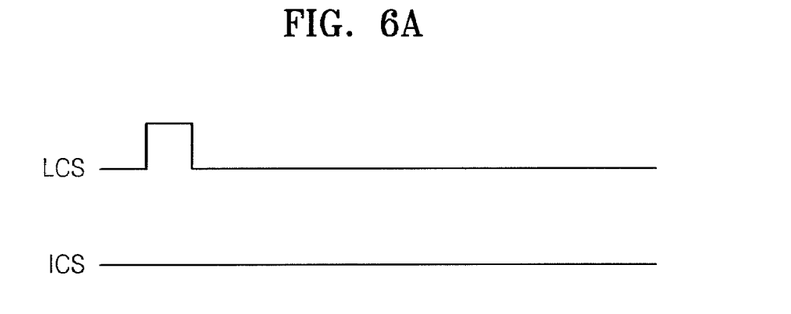
FIGS. 6A through 6C are diagrams for illustrating the relationship between program voltage increments, a loop clock signal, and an ISSP clock signal in the ISPP variably controlling method of FIG. 2, according to an exemplary embodiment of the present invention.
Figure 6B:
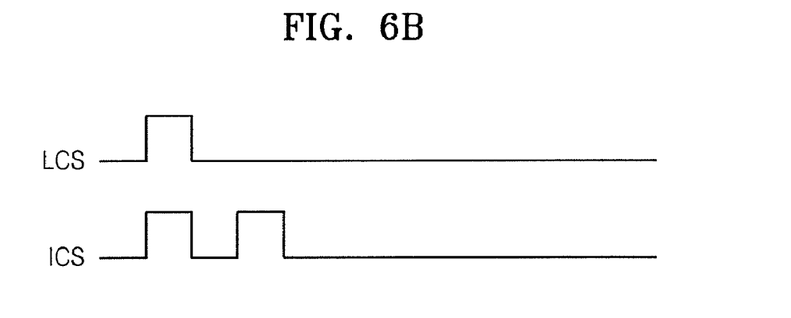
Figure 6C:
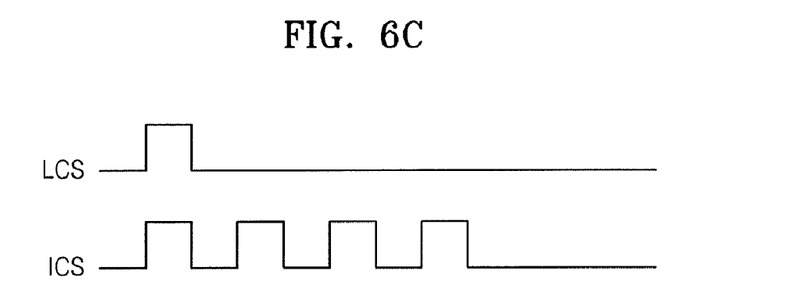

The relationship between the increments ΔISPP1, ΔISPP2, and ΔISPP3 of the program voltages described with reference to FIG. 2, the loop clock signal LCS, and the ISPP clock signal ICS is described with reference to FIGS. 6A through 6C. In FIG. 6A, when ΔISPP1 is 0.3 V, the loop clock signal LCS which increases the coding value of the default level enable signal DLE[m:0] by +1 is generated as one pulse. The ISPP clock signal ICS is not generated. In FIG. 6B, when ΔISPP1 is 0.4 V, the loop clock signal LCS which increases the coding value of the default level enable signal DLE[m:0] by +1 is generated as one pulse and the ISPP clock signal ICS which increases the coding value of the additional level enable signal ALE[n:0] by +2 is generated as two pulses. In FIG. 6C, when ΔISPP1 is 0.5 V, the loop clock signal LCS which increases the coding value of the default level enable signal DLE[m:0] by +1 is generated as one pulse and the ISPP clock signal ICS which increases the coding value of the additional level enable signal ALE[n:0] by +4 is generated as four pulses.

In a programming method for a flash memory device according to an exemplary embodiment of the present invention, the increments of the program voltages in each state are determined, the programming property is increased, and the threshold voltage distributions of the finally programmed cells are narrowed from the threshold voltage distributions of the multi-level memory cells in each state obtained by testing the flash memory device. Accordingly, the intervals between the threshold voltage distributions in each state of the programmed cells are widened by the program voltages that are variably increased in program stages, and thus the reliability of a cell operation increases.

While exemplary embodiments of the present invention have been particularly shown and described with reference to the figures, it will be understood by those of ordinary skill in the art that various changes in form and details may be made therein without departing from the spirit and scope of the present invention.

What is claimed is:

1. A method of programming a flash memory device, the method comprising:
   setting increments of program voltages according to one or more data states expressed as one or more threshold voltage distributions of multi-level memory cells;
   generating an Increment Step Pulse Programming (ISPP) clock signal in response to program pass/fail information, the ISPP clock signal corresponding to a loop clock signal and to the increments of the program voltages;

generating a default level enable signal by performing a first counting operation that counts up to the increments of the program voltages, in response to the loop clock signal;

generating an additional level enable signal by performing a second counting operation that counts up to the increments of the program voltages, in response to the ISPP clock signal;

increasing the program voltage by 1 increment, in response to the default level enable signal; and increasing the program voltage by 2 increments, in response to the additional level enable signal.

2. The method of claim 1, wherein each data state is obtained as a result of testing the flash memory device having the multi-level memory cells.

3. The method of claim 1, wherein each of the 2 increments that the program voltage is increased by, in response to the additional level enable signal, is less than the 1 increment.

4. The method of claim 1, further comprising:
distributing the program voltages;
comparing the distributed program voltages with a reference voltage and generating a pumping clock signal according to the result of the comparison; and
generating the program voltages in response to the pumping clock signal.

5. A flash memory device comprising:
a program control logic unit generating a loop clock signal and an Increment Step Pulse Programming (ISPP) information signal, in response to program pass/fail information;
an ISPP control logic unit generating a default level enable signal and an additional level enable signal, in response to the loop clock signal and the ISPP information signal;
a program voltage regulator variably increasing a program voltage, distributing the program voltage and comparing it to a reference voltage, and generating a pumping clock signal according to the result of the comparison, in response to the default level enable signal and the additional level enable signal; and
a charge pump unit generating the program voltage, in response to the pumping clock signal.

6. The flash memory device of claim 5, wherein the ISPP information signal includes information pertaining to increments of the program voltage for each data state determined from threshold voltage distributions of multi-level memory cells in each of a plurality of data states obtained as a result of testing the flash memory device.

7. The flash memory device of claim 5, wherein the ISPP control logic unit comprises:
a clock generator receiving the loop clock signal and the ISPP information signal and generates an ISPP clock signal;
a first counter performing a counting operation and generating a corresponding default level enable signal when output values of the first counter reach target increments of the program voltage, in response to the loop clock signal; and
a second counter performing a counting operation and generating a corresponding additional level enable signal when output values of the second counter reach target increments of the program voltages, in response to the ISPP clock signal.

8. The flash memory device of claim 5, wherein the program voltage regulator comprises:

a plurality of first and second resistors connected between the generated program voltage and the distributed program voltage, in series;

a first level control unit selectively short-circuiting the first resistors, in response to the default level enable signal;

a second level control unit selectively short-circuiting the second resistors, in response to the additional level enable signal; and a level detection and pumping clock control unit receiving an oscillation signal, comparing the distributed program voltage and the reference voltage, and generating the oscillation signal as the pumping clock signal according to the result of the comparison.

9. The flash memory device of claim 8, wherein the first level control unit comprises:
a plurality of switches transmitting a high voltage in response to the default level enable signal; and
a plurality of high voltage NMOS transistors selectively short-circuiting the first resistors, in response to outputs of the switches.

10. The flash memory device of claim 8, wherein the second level control unit comprises:
a plurality of switches transmitting a high voltage in response to the additional level enable signal; and
a plurality of high voltage NMOS transistors selectively short-circuiting the second resistors, in response to outputs of the switches.

11. The flash memory device of claim 8, wherein the level detection and pumping clock control unit comprises:
a comparator comparing the distributed program voltage with the reference voltage;
a NAND gate receiving the oscillation signal and an output of the comparator; and
an inverter receiving an output of the NAND gate and outputting the pumping clock signal based on the received output of the NAND gate.

12. A flash memory device comprising:
a program control logic unit generating a loop clock signal, an Increment Step Pulse Programming (ISPP) information signal, a discharge enable signal, and a regulator enable signal, in response to program pass/fail information;
an ISPP control logic unit generating a default level enable signal and an additional level enable signal, in response to the loop clock signal and the ISPP information signal;
a program voltage regulator variably increasing a program voltage, distributing the program voltage, generating a first voltage by distributing the program voltage, comparing the first voltage with a reference voltage, and generating a pumping clock signal, in response to the discharge enable signal, the default level enable signal, the additional level enable signal, and the regulator enable signal; and
a charge pump unit generating the program voltage, in response to the pumping clock signal.

13. The flash memory device of claim 12, wherein the ISPP information signal includes information pertaining to increments of the program voltages in each of a plurality of data states determined from threshold voltage distributions of multi-level memory cells at each of the plurality of data states obtained as a result of testing the flash memory device.

14. The flash memory device of claim 12, wherein the ISPP control logic unit comprises:
a clock generator receiving the loop clock signal and the ISPP information signal and generating an ISPP clock signal;

a first counter performing a counting operation and generating a corresponding default level enable signal when output values of the first counter reach target increments of the program voltages, in response to the loop clock signal; and a second counter performing a counting operation and generating a corresponding additional level enable signal when output values of the second counter reach target increments of the program voltages, in response to the ISPP clock signal.

15. The flash memory device of claim 12, wherein the program voltage regulator comprises:

a discharge circuit unit discharging the program voltage to a power voltage, in response to the discharge enable signal;

a first level control unit comprising a plurality of first resistors connected between the program voltage and a second voltage in series and selectively short-circuiting the first resistors, in response to the default level enable signal;

a second level control unit comprising a plurality of second resistors connected between the second voltage and the first voltage in series and selectively short-circuiting the second resistors, in response to the additional level enable signal; and a level detection and pumping clock control unit receiving an oscillation signal, comparing the first voltage with the reference voltage, and generating the oscillation signal as a pumping clock signal according to the result of the comparison.

16. The flash memory device of claim 15, wherein the discharge circuit unit comprises a PMOS transistor connected in series between the power voltage and the program voltage and a NMOS transistor of a high voltage depletion type, wherein a gate of the PMOS transistor is connected to the discharge enable signal and a gate of the high voltage depletion type NMOS transistor is connected to the power voltage.

17. The flash memory device of claim 15, wherein the first level control unit comprises:

the first resistors;

a plurality of switches transmitting high voltage in response to the default level enable signal; and a plurality of high voltage NMOS transistors selectively short-circuiting the first resistors, in response to outputs of the switches.

18. The flash memory device of claim 15, wherein the second level control unit comprises:

the second resistors;

a plurality of switches transmitting a high voltage in response to the additional level enable signal; and a plurality of high voltage NMOS transistors selectively short-circuiting the second resistors, in response to outputs of the switches.

19. The flash memory device of claim 15, wherein the regulator enable circuit unit comprises a resistor and a NMOS transistor connected in series between the first voltage and a ground voltage, wherein a gate of the NMOS transistor is connected to the regulator enable signal.

20. The flash memory device of claim 15, wherein the level detection and pumping clock control unit comprises:

a comparator which compares the first voltage and the reference voltage;

a NAND gate which receives an output of the comparator and the oscillation signal; and an inverter which receives an output of the NAND gate and outputs the pumping clock signal based on the received output of the NAND gate.

* * * * *